United States Patent [19]
Keller et al.

[11] Patent Number: 5,651,856
[45] Date of Patent: Jul. 29, 1997

[54] SELECTIVE ETCH PROCESS

[75] Inventors: David J. Keller; Kevin G. Donohoe, both of Boise, Id.

[73] Assignee: Micron Technology, Inc., Boise, Id.

[21] Appl. No.: 589,758

[22] Filed: Jan. 22, 1996

[51] Int. Cl.$^6$ ................................................. H01L 21/00
[52] U.S. Cl. ........................ 156/643.1; 156/651.1; 156/657.1; 156/659.11; 216/67; 252/79.1
[58] Field of Search .................. 156/643.1, 651.1, 156/657.1, 659.11; 252/79.1; 216/67

[56] References Cited

U.S. PATENT DOCUMENTS

| | | | |
|---|---|---|---|
| 4,040,892 | 8/1977 | Sargent et al. | 156/659 |
| 4,708,766 | 11/1987 | Hynecek | 156/643 |
| 5,277,750 | 1/1994 | Frank | 156/643 |
| 5,338,395 | 8/1994 | Keller et al. | 156/643 |

*Primary Examiner*—William Powell
*Attorney, Agent, or Firm*—Workman, Nydegger and Seeley

[57] ABSTRACT

Disclosed is an etch process wherein hydrogen monoiodide (HI) ions are employed to bombard a patterned film, thereby creating geometric features in the patterned film with substantially anisotropic sidewalls. The etch process has a high selectivity to oxide, allowing the etch process to terminate on a thin pad oxide, especially when using a two step etch process. The etch process is also highly selective to photoresist, further enhancing the resulting anisotropic nature of the geometrical feature sidewalls.

20 Claims, 2 Drawing Sheets

SELECTIVE ETCH PROCESS

BACKGROUND OF THE INVENTION

1. The Field of the Invention

The present invention relates to semiconductor device manufacturing. More particularly, the present invention is directed to a process for enhancing etch selectivity and uniformity when etching silicon-containing materials in semiconductor device manufacturing.

2. The Relevant Technology

The integrated circuit manufacturing industry is rapidly progressing toward more highly advanced and miniaturized integrated circuits. This progress is effectively revolutionizing the electronics industry due to the higher capability of the electronic devices that can be produced as a result. In order to continue this progress, however, new manufacturing processes are needed which have the capability of producing the finer features that are required. For instance, improved processes are needed to etch substantially normal or anisotropic submicron sidewalls on silicon substrates of in-process integrated semiconductor circuits. New processes are also needed to etch submicron geometric features in films on the silicon substrates to exact depths. Consequently, the new processes must have a high selectivity to photoresist and to pad oxides.

The prior art has utilized methods such as the use of diatomic chloride in ionized plasma etches to emphasize the physical aspects of the etch, so as to produce more anisotropic sidewalls. Etch processes have even been conducted in two stages, a primary etch and a secondary etch, with the secondary etch using less active compounds. However, as features become smaller, even these processes are proving insufficient.

One example of a drawback of current prior art processes is shown in FIG. 1. Therein is shown a line space pair 12 being etched in a film of polysilicon 14. Polysilicon film 14 is formed over a pad oxide 16 on a silicon substrate 10. Above polysilicon film 14 is a patterned layer of photoresist 18. It can be seen from FIG. 1 that the ionized etchant material attacks the exposed surface of polysilicon film 14.

The prior art etch also has a tendency to attack the sidewalls of line space pair 12. This results in undercutting of polysilicon film 14 beneath photoresist layer 18. Furthermore, when using reactive etchants such as diatomic chloride, the sidewalls of photoresist layer 18 are also eroded, thereby giving the etchant even greater access to the sidewalls 20 of line space pair 12, and resulting in non-anisotropically sloped sidewalls. This is problematic, as it alters the critical dimensions of the device features. Also, the non-anisotropically sloped sidewalls are undesirable, as it often necessary when forming certain features of integrated circuits, such as gate regions in DRAM memory cells, to etch lines and other graphic features anisotropically. Anisotropic etches are also desirable as they allow for higher device density and consequently, greater integrated circuit miniaturization.

Thus, it can be seen that a need exists in the art for an etch process with which selectivity to both photoresist and oxide can be increased, and which results in a more anisotropic nature of sidewalls in etched geometrical features.

SUMMARY AND OBJECTS OF THE INVENTION

The present invention seeks to resolve the above and other problems which have been experienced in the art. More particularly, the present invention constitutes an advancement in the art by providing a highly selective etch process which achieves each of the objects listed below.

It is an object of the present invention to provide an etch process whereby silicon-containing films such as polysilicon, single crystal silicon, or silicon nitride can be etched in a substantially anisotropic manner.

It is also an object of the present invention to provide such an etch process which has high selectivity to photoresist for maintaining an anisotropic etch process.

It is another object of the present invention to provide such an etch process which has high selectivity to oxides.

It is likewise an object of the present invention to provide an etch process which forms a strong passivation layer on sidewalls of the geometrical features being etched, with the result of substantially anisotropic sidewalls.

It is further an object of the present invention to provide such an etch process whereby precision etching can be conducted using a two step process.

To achieve the foregoing objects, and in accordance with the invention as embodied and broadly described herein in the preferred embodiment, an etch process is provided which utilizes ions of an iodide containing compound such as hydrogen monoiodide (HI) ions to bombard a patterned film on a silicon substrate of an in-process integrated semiconductor circuit. The etch process thereby creates geometrical features in the film that have substantially anisotropic sidewalls. The etch process has a high selectivity to oxide, making it easy to stop on a thin pad oxide. The etch process also has a high selectivity to photoresist, further enhancing the anisotropic nature of the resulting etched geometrical feature sidewalls. Due to the high selectivity to photoresist, thinner photoresist mask layers can be used, thereby enhancing the photolithography process.

The first step of the process of the present invention comprises preparing the film that is to be etched. This typically comprises forming an in-process integrated semiconductor circuit and depositing the film thereon. Next, a photoresist layer is formed on the film and patterned. In a further step, the in-process integrated semiconductor circuit is placed in a reactive ion etching chamber or other such chamber, the chamber is evacuated, and the film is exposed to ionized etchants.

Preferably, the film is exposed to ionized etchants in two operations, a primary etch and a secondary etch. The primary etch is conducted utilizing a highly reactive etchant such as chlorine, and is conducted for the majority of the etch distance. Typically, in etching line and space openings at current depths, the primary etch is conducted for a time sufficient to etch between about 5,000 and 7,000 Angstroms. About 300 to 400 Angstroms are left to be etched by the secondary etch. The secondary etch typically comprises a halogen-containing compound such as $NF_3$, $Cl_2$, or HBr in combination with hydrogen monoiodide (HI).

The HI used in the secondary etch is a very passive etchant, and also forms a byproduct in the form of a passivation layer comprising a silicon iodide (SiI) containing polymer, which forms on sidewalls of the geometrical features being etched. A high energy is required to penetrate the passivation layer on the sidewalls. The energy of the ion bombardment is sufficient to etch past the passivation layer at the respective bottoms of the sidewalls, but the ion bombardment does not have access to the sidewalls due to a substantially normal angle of incidence. Further, the ion bombardment is unable to penetrate the passivation layer on the sidewalls. Consequently, a substantially anisotropic sidewall results.

Furthermore, due to the high selectivity to oxide of the etch process, it is easy to terminate the etch at an exact depth by providing a pad oxide at the bottom of the line space pair. Furthermore, as the photoresist is not substantially etched, the critical dimensions of the geometrical features are maintained, and the sidewalls of the geometrical features are further protected from being etched.

The etch is preferred for use with silicon-containing compounds such as polysilicon, single crystal silicon, silicon nitride, and refractory metal silicides.

Thus, an etch process is provided which can be used to etch highly anisotropic sidewalls of geometrical features in silicon-containing compounds. The etch process has high selectivity to oxide in order to stop at exact depths, and also has high selectivity to photoresist such that the critical dimensions and anisotropic nature of the sidewalls are further maintained.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises the use of an etchant which emphasizes the physical aspect of an ion plasma etch process. The result is a focusing of the etch on exposed surfaces and the formation of an effective passivation layer on the sidewalls of the geometrical features being formed. This serves to form more anisotropic geometrical features. Also, as the etch process has high selectivity to oxides, the etch process results in more precise formation of the geometrical features and greater control of the depth of the etch.

Figure 1:
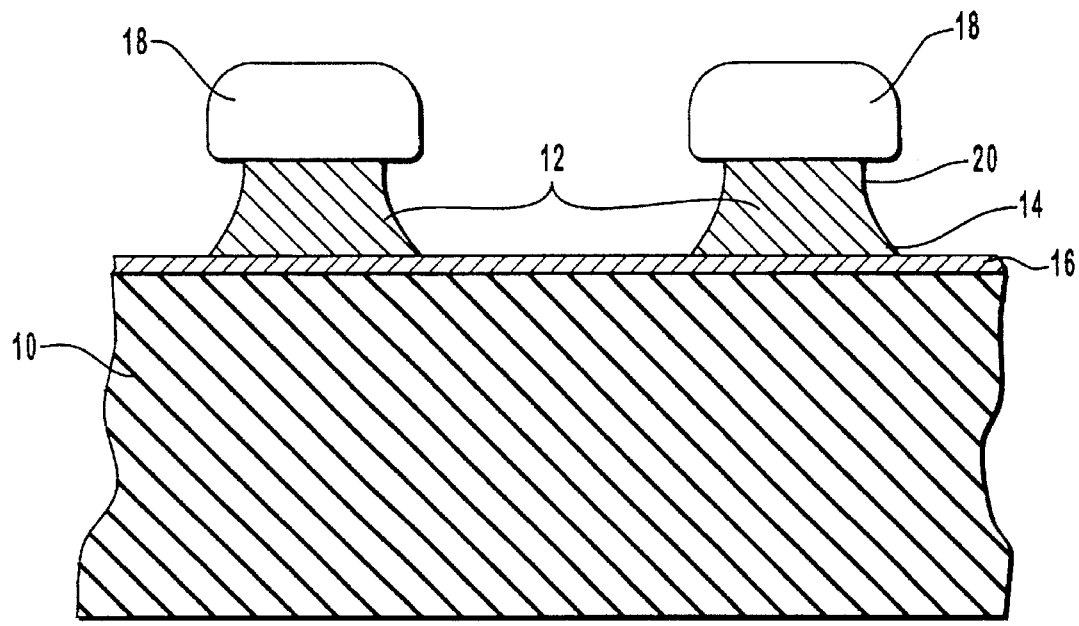
FIG. 1 is a schematic cross-sectional representation of an in-process integrated semiconductor circuit of the prior art undergoing an etch operation and showing the prior art problem of undercutting.
Figure 2:
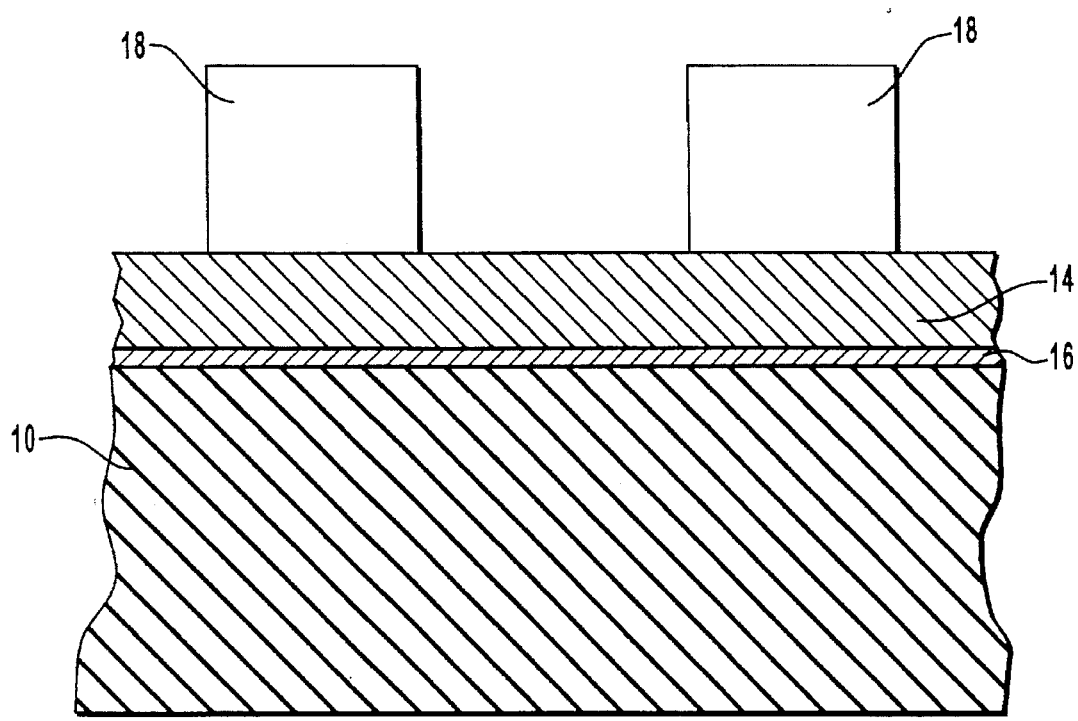
FIG. 2 is a schematic cross-sectional representation of an in-process integrated semiconductor circuit shown prepared for the etch process of the present invention with a patterned photoresist layer.

FIG. 2 illustrates the first step of the present invention which comprises preparing a surface to be etched. This typically comprises forming a surface such as a polysilicon or other silicon-containing layer on a silicon substrate 10 of an in-process integrated semiconductor circuit. Such a structure is shown in FIG. 2, where the surface to be etched comprises a polysilicon layer 14. Polysilicon layer 14 is masked with a photoresist layer 18 using photolithography. A pad oxide 16 can be formed on silicon substrate 10 before depositing polysilicon layer 14 in order to set the depth of the etch process.

Figure 3:
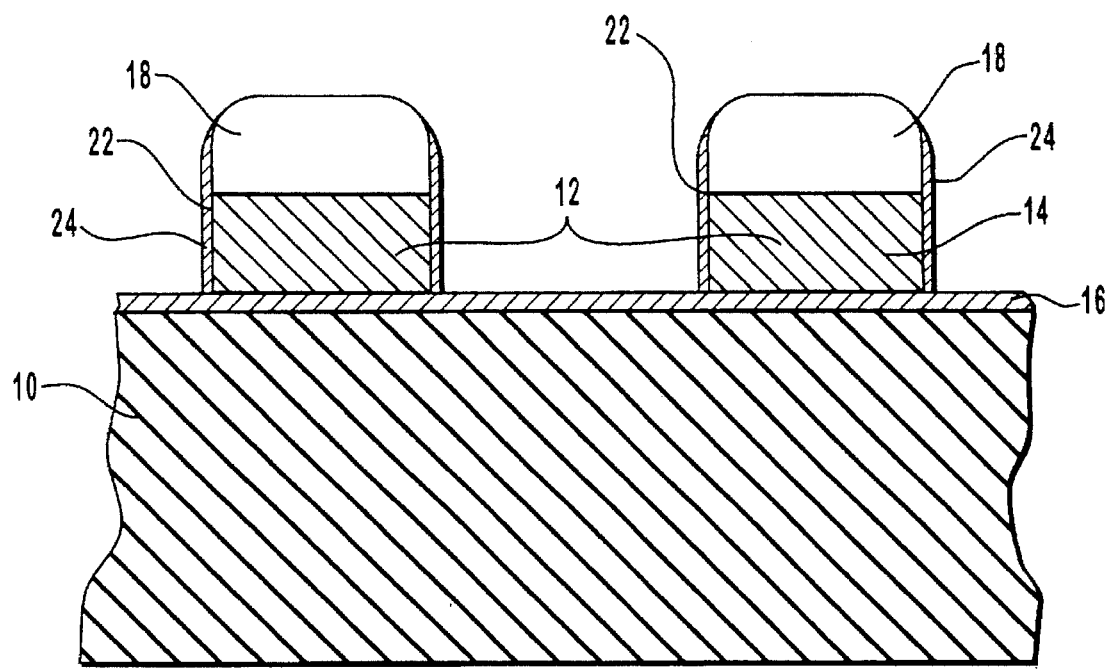
FIG. 3 is a schematic cross-sectional representation of the in-process integrated semiconductor circuit of FIG. 2, shown subsequent to an etch process conducted under the present invention.

A further step comprises placing the in-process integrated semiconductor circuit in an etch chamber. One possible etch chamber comprises an Applied 5000 magnetically enhanced reactive ion etcher sold by Applied Materials Corporation of Santa Clara, Calif., USA. The etch chamber is then evacuated to a low pressure. Next, an etchant is flowed into the chamber and the in-process integrated semiconductor circuit is exposed to the etchant. A bias is then applied to the in-process integrated semiconductor circuit or to the holder of the wafer on which is situated the in-process integrated semiconductor circuit. This step is illustrated in FIG. 3.

The in-process integrated semiconductor circuit is preferably exposed to the etchant in a primary etch and a secondary etch. The primary etch preferably has a high etch rate, while the secondary etch has a lower etch rate and a high selectivity to oxide. Examples of the etchant used in the primary etch include diatomic chloride, and fluorine-containing compounds such as $NF_3$. The primary etch may also contain a portion of an iodide containing compound such as hydrogen monoiodide (HI). The secondary etch preferably uses an etchant comprising an iodide containing compound such as hydrogen monoiodide and a compound containing diatomic chloride, fluorine, or bromine.

The primary etch is preferably conducted by flowing diatomic chlorine ($Cl_2$) at a rate of approximately 45 SCCM, and a fluorine-containing compound, preferably nitrogen fluoride ($NF_3$), at a rate of approximately 5 SCCM for a time in the approximate range of 30 to 60 seconds. The preferred pressure when using the Applied 5000 etcher is in the approximate rage of 100 milliTorr and the preferred power is approximately 500 watts. One of ordinary skill in the art will understand that the above values will vary depending on the make and model of the etcher used in the process. An inert gas, preferably argon (Ar) can also be added to the etch plasma. The inert gas tends to further enhance the uniformity of the etch process. Argon is preferred because of its weight and commercial availability, but other inert gasses can also be used.

It should also be noted that because of the high $Cl_2$ ion bombardment, the $Cl_2$ flow must be stopped before the exposed features are cleared from the silicon substrate. If the features are allowed to be cleared, the high ionic bombardment will cause the $Cl_2$ to penetrate the oxide layer. Hence, the primary etch is stopped while there is a fair amount of film left on the in-process integrated semiconductor circuit. Thus, one drawback of such a physical $Cl_2$ etch is that it has a very poor selectivity to the underlying pad oxide. To substantially alleviate this problem, the process of the present invention employs a highly selective secondary etch. The secondary etch, also known as the "overetch," comprises flowing a fluorine-containing compound or chlorine, flowed at a rate of approximately 30 SCCM along with the HI flowed at a rate of approximately 15 SCCM. The secondary etch is timed and typically lasts about 35 seconds. The preferred pressure is about 300 milliTorr, and the preferred power is about 100 watts. Again, process parameters will vary with the make and model of the etcher employed in the process.

During the etch process, the primary etch etches down about 5,000–7,000 Angstroms into polysilicon layer 14, and typically leaves about 300 to 400 Angstroms to be etched. Thus, once the etch gets within about 300 to 400 Angstroms of the pad oxide, the primary etch is stopped and the secondary etch is applied. At this point, the etch becomes largely attributable to the physical component of the etch process, due to the selection of HI as an etchant. The high passivity of the HI helps to give a high selectivity to the underlying oxide. The HI is also a higher order halogen, and consequently combines to form a strong passivation layer 24 on sidewalls 22 being etched, to result in geometrical features 15, seen in FIG. 4.

Figure 4:
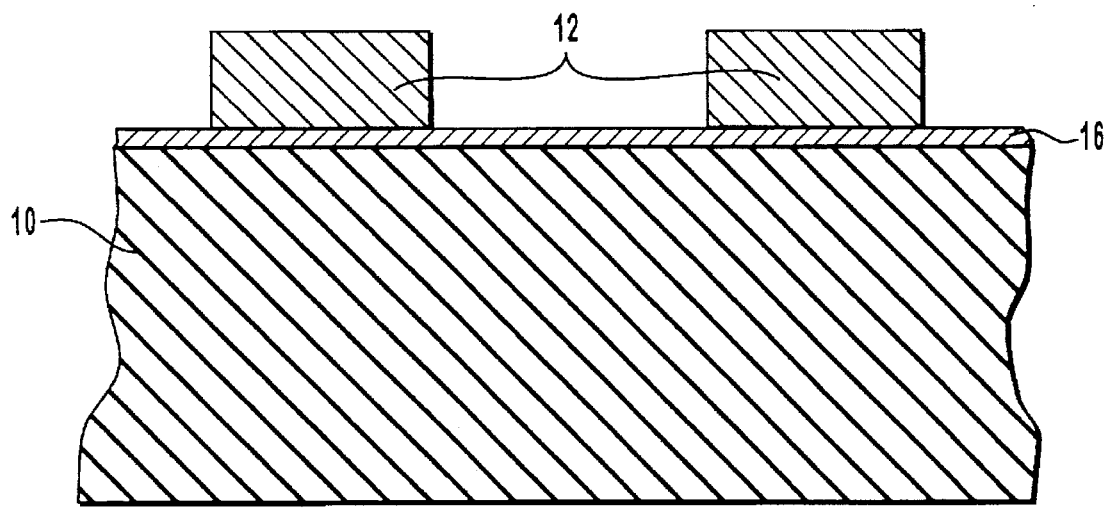
FIG. 4 is a schematic cross-sectional representation of the in-process integrated semiconductor circuit of FIG. 3, shown after the inventive etch process has been conducted and the photoresist layer has been stripped.

Passivation layer 24 comprises some form of silicon iodide (SiI) containing polymer. In order to etch through passivation layer 24, high energy from the impinging ions of the ion bombardment are necessary. Without this added energy, the etch cannot pass through passivation layer 24. The nature of ion bombardment is that the ions bombard at a substantially normal angle of incidence. Thus, only the exposed surfaces of geometrical features such as the bottom of the line space pair 12 illustrated in FIG. 4, are exposed to the energy of the ions. Sidewalls 22, which form the periphery of line space pair 12, are not exposed, and thus passivation layer 24 prevents etching into sidewalls 22 by the active chemical compounds. Consequently, sidewalls 22 are not substantially etched, and the etch produces substantially anisotropic sidewalls 22.

Furthermore, sidewalls 22 of photoresist layer 18 are also passivated, and as the etchant is highly selective to photoresist layer 18, photoresist layer 18 is not substantially etched away, thus further helping to maintain the critical dimensions and anisotropic nature of geometrical features such as line space pair 12 on polysilicon layer 14.

The amount of ion bombardment and the power applied in creating the bias is selected in order to attain the optimum amount of selectivity. The oxide has a greater bond strength than films such as polysilicon and nitride. Thus, when the proper amount of power is applied, the bonds are broken on the polysilicon and the nitride but are not substantially broken on the pad oxide. This is especially advantageous with the use of polysilicon, for which it is difficult to correctly set the energy level such that undercutting into sidewalls 22 does not occur. Because of the greater passivity and slower etch rate, as well as high selectivity to oxide of the iodine in the HI, it is easier to set this level of power.

The compound NF$_3$ is advantageous for use with the secondary etch, as it gives a very high silicon and nitride etch rate but is still selective to oxide and photoresist when combined with HI. The compound SF$_6$ has also been found to be advantageous for use in the secondary etch. Using SF$_6$ and HI, the etch rate of the secondary etch will be in a range of about 1,000 to about 1,500 Angstroms per minute. Thus, with this slow etch rate it is easy to completely etch the line space pair such as line space pair 12 but not etch substantially into the underlying pad oxide layer, particularly when the secondary etch is limited to about 300 to 400 Angstroms.

The results of the secondary etch step are shown in FIG. 3, where it can be seen that anisotropic sidewalls 22 have resulted, and essentially no undercutting occurs in fully etched line space pair 12 seen in FIG. 4. Thus, submicron features can be etched with considerable reliability. Furthermore, the photoresist pattern exhibits less faceting than with methods of the prior art, consequently having less impact on the resulting film features.

The final step is to remove the photoresist from the film surface. The resulting structure is shown as line space pair 12 in FIG. 4.

The etch process is not limited to the two step embodiment discussed above. Alternatively, the etch could be conducted in a single step. For instance, the etch could be conducted in a single step with a fluorine-containing compound and HI. Also, the etch could conceivably comprise solely HI in a single step, or HI could be used alone in one of multiple steps.

Other etch chambers can also be used with the etch process of the present invention. For instance, a reactive ion etcher (RIE) such as the Lam Rainbow available from Lam Research of the city of Fremont, in the state of California, USA, could be used and would be preferably set with a high pressure of between 200 milliTorr and 500 milliTorr Alternatively, a high density etcher such as the Lam 9400 high density etcher, also available from Lain Research, can also be used, and is preferably set with a pressure of between about 20 and 80 milliTorr. The high density etcher should also be set with a pressure of about 10 milliTorr, a power in a range of about 300–900 watts at the top electrode, and a power in a range of about 150–225 watts at the bottom electrode.

Films which are preferred to be etched by the process of the present invention comprise polysilicon, as well as single crystal silicon, silicon nitride and refractory metal silicides such as tungsten silicide, molybdenum silicide, and cobol silicide. Essentially the only silicon-containing material which it is predicted would not be etched effectively is silicon dioxide, due to its high bond strength.

Specific applications for the etch include etching polysilicon over very thin gate oxides. One advantage is that vertical profiles are maintained. The etch process can also be used to enhance the selectivity between polysilicon and photoresist. Also, the etch process can be used to etch nitride features having underlying pad oxides with a high selectivity to the underlying pad oxides.

Thus, a process is provided with which silicon-containing films can be etched with high selectivity to oxide and photoresist, and whereby a passivation layer will be formed which requires a sufficiently high ionization energy to penetrate feature sidewalls so that the sidewalls will not be substantially etched but rather will be formed in a highly anisotropic manner.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An etch process which forms substantially anisotropic sidewalls and which has a high selectivity to oxide and photoresist, the etch process comprising:

(a) preparing a pattered film to be etched on an in-process integrated semiconductor circuit; and (b) exposing the film to ionized hydrogen monoiodide (HI), the film being selected from the group consisting of single crystal silicon, polysilicon, silicon nitride, and refractory metal silicide, whereby a geometric feature is formed in the film, the geometric feature defining an anisotropic sidewall.

2. An etch process as recited in claim 1, wherein the patterned film is exposed to an iodide containing compound in combination with a fluorine-containing compound.

3. An etch process as recited in claim 1, wherein the patterned film is exposed to an iodide containing compound in combination with a chlorine-containing compound.

4. An etch process as recited in claim 1, wherein the patterned film is exposed to an iodide containing compound in combination with a bromine containing compound.

5. An etch process as recited in claim 1, wherein the patterned film is exposed to an iodide containing compound in combination with at least one of the group comprising fluorine, chlorine, and bromine.

6. An etch process as recited in claim 1, wherein the etch process deposits a passivation layer on the sidewall, the passivation layer comprising a polymer containing silicon iodide, and wherein the passivation layer prevents the etch process from substantially etching into the sidewall.

7. An etch process as recited in claim 1, wherein the patterned film is covered with a photoresist layer, the photoresist layer being patterned such that sidewalls are defined in the photoresist layer, and wherein the etch process does not substantially etch into the sidewalls of the photoresist layer.

8. An etch process as recited in claim 1, further comprising the step of conducting a primary etch prior to exposing the patterned film to ionized an iodide containing compound, the primary etch comprising exposing the patterned film to an ionized etchant having a high etch rate, and wherein the step of exposing the patterned film to an ionized iodide containing compound further comprises a secondary etch of exposing the patterned film to a compound containing an iodide containing compound, the compound containing an iodide containing compound providing a substantially slower etch rate than the high etch rate of the ionized etchant of the primary etch.

9. An etch process as recited in claim 8, wherein the primary etch is conducted with an etchant comprising a chlorine-containing compound.

10. An etch as recited in claim 8, wherein the compound of the secondary etch comprises $SF_6$ and an iodide containng compound.

11. An etch process as recited in claim 1, further comprising a pad oxide underlying the patterned film to be etched and wherein the etch step etches up to and not into the pad oxide so as to selectively stop on the pad oxide.

12. An etch process which forms substantially anisotropic sidewalls and which has a high selectivity to oxide and photoresist, the etch process comprising:

(a) preparing a patterned film to be etched on a silicon substrate of an in-process integrated semiconductor circuit;

(b) conducting a primary etch by exposing the patterned film to an ionized etchant having a high etch rate; and (c) conducting a secondary etch by exposing the patterned film to a compound containing ionized hydrogen monoiodide (HI), the secondary etch having a substantially slower etch rate than the primary etch, and the patterned film being selected from the group consisting of single crystal silicon, polysilicon, silicon nitride, and refractory metal silicide, whereby a geometric feature is formed in the patterned film as a result of the primary and secondary etch steps, the geometric feature defining a sidewall.

13. An etch process as recited in claim 12, wherein the secondary etch deposits a passivation layer on the sidewall, the passivation layer comprising a polymer containing silicon iodide, containing polymer, and wherein the passivation layer prevents etching into the sidewall.

14. An etch process as recited in claim 13, wherein the patterned film is covered with a photoresist layer, the photoresist layer being patterned such that sidewalls are defined in the photoresist layer, and wherein the etch process does not substantially etch into the sidewalls of the photoresist layer.

15. An etch process as recited in claim 14, wherein the ionized etchant used in the primary etch step comprises $Cl_2$ and $NF_3$.

16. An etch process as recited in claim 15, wherein the compound of the secondary etch comprises ionized $NF_3$ and an iodide containng compound.

17. An etch process as recited in claim 15, wherein the patterned film overlies a pad oxide, and wherein the etch is selective to the pad oxide such that the secondary etch does not etch into the pad oxide so as to be selective to the pad oxide.

18. An etch process as recited in claim 17, wherein the patterned film being etched by the primary and secondary etch steps comprises polysilicon.

19. An etch process as recited in claim 18, wherein the primary and secondary etch steps are conducted by ionizing the etchants thereof in a reactive ion etcher.

20. An etch process which forms substantially anisotropic sidewalls of an in-process semiconductor circuit, the etch process having highly selectivity to oxide and to photoresist, the etch process comprising the steps of:

(a) preparing a patterned polysilicon film to be etched on an in-process integrated semiconductor circuit;

(b) conducting a primary etch in a reactive ion etcher by exposing the patterned polysilicon film to an ionized etchant comprising $Cl_2$ and $NF_3$; and (c) conducting a secondary etch in the reactive ion etcher by exposing the patterned polysilicon film to an ionized etchant comprising $NF_3$ and an iodide containng compound, the secondary etch having a substantially slower etch rate than the primary etch, with the patterned polysilicon film being disposed over a pad oxide, and the secondary etch being selective to the pad oxide such that the etch stops on and does not etch into the pad oxide, and wherein a geometric feature is formed by the etch process, the geometric feature defining a sidewall, the etch process depositing a passivation layer on the sidewall, the passivation layer comprising silicon iodide, and the passivation layer preventing the secondary etch from substantially etching into the sidewall, and wherein the patterned polysilicon film is covered with a photoresist layer, the photoresist layer being patterned such that sidewalls are defined in the photoresist layer, and wherein the etch process does not substantially etch into the sidewalls of the photoresist layer.

* * * * *

UNITED STATES PATENT AND TRADEMARK OFFICE
CERTIFICATE OF CORRECTION

PATENT NO. : 5,651,856
DATED : July 29, 1997
INVENTOR(S) : David J. Keller; Kevin G. Donohoe It is certified that error appears in the above-identified patent and that said Letters Patent is hereby corrected as shown below:

Col. 1, line 52, change "it often" to --it is often--

Col. 4, line 15, change "circuit This" to --circuit. This--

Col. 5, line 9, change "features 15" to --features 12--

Col. 6, line 13, change "Lain" to --Lam--

Col. 7, line 35, change "containng" to --containing--

Col. 8, line 17, change "containng" to --containing--

Col. 8, line 39, change "containng" to --containing--

Signed and Sealed this

Twenty-eighth Day of April, 1998

Attest:

BRUCE LEHMAN

Attesting Officer

Commissioner of Patents and Trademarks